United States Patent
Choi et al.

(10) Patent No.: US 7,625,812 B2
(45) Date of Patent: Dec. 1, 2009

(54) SILICON NANO WIRES, SEMICONDUCTOR DEVICE INCLUDING THE SAME, AND METHOD OF MANUFACTURING THE SILICON NANO WIRES

(75) Inventors: Byoung-lyong Choi, Seoul (KR); Wan-jun Park, Seoul (KR); Eun-kyung Lee, Suwon-si (KR); Jao-woong Hyun, Uijeongbu-si (KR)

(73) Assignee: Samsung Electronics Co., Ltd. (KR)

( * ) Notice: Subject to any disclaimer, the term of this patent is extended or adjusted under 35 U.S.C. 154(b) by 309 days.

(21) Appl. No.: 11/362,897

(22) Filed: Feb. 27, 2006

(65) Prior Publication Data
US 2007/0020950 A1  Jan. 25, 2007

(30) Foreign Application Priority Data
Feb. 25, 2005 (KR) .................. 10-2005-0016184
Feb. 1, 2006 (KR) .................. 10-2006-0009821

(51) Int. Cl.
*H01L 21/38* (2006.01)
(52) U.S. Cl. ............... 438/558; 438/542; 257/E21.352; 257/E21.466
(58) Field of Classification Search ............ 438/542, 438/558; 117/75; 257/E21.352, E21.466
See application file for complete search history.

(56) References Cited
U.S. PATENT DOCUMENTS
2004/0005723 A1*  1/2004  Empedocles et al. ............ 438/1
2005/0006673 A1*  1/2005  Samuelson et al. .......... 257/232
2005/0253138 A1*  11/2005  Choi et al. .................... 257/40

FOREIGN PATENT DOCUMENTS
CN          1453884        11/2003
KR     10-2004-0000418     1/2004

OTHER PUBLICATIONS

J.G. Patridge et al. "Templated cluster assembly for prodution of metallic nanowires in passivated silicon V-grooves", Microelectric Engineering 73-74 (2004), pp. 583-587.*
CN OA Sep. 5, 2008 All references cited in the Foreign Office Action and not previously submitted are listed above.

* cited by examiner

Primary Examiner—Asok K Sarkar
Assistant Examiner—Julia Slutsker
(74) Attorney, Agent, or Firm—Cantor Colburn LLP

(57) ABSTRACT

A method of manufacturing silicon nano wires including forming microgrooves on a surface of a silicon substrate, forming a first doping layer doped with a first dopant on the silicon substrate and forming a second doping layer doped with a second dopant between the first doping layer and a surface of the silicon substrate, forming a metal layer on the silicon substrate, forming catalysts by heating the metal layer within the microgrooves of the silicon substrate and growing the nano wires between the catalysts and the silicon substrate using a thermal process.

12 Claims, 8 Drawing Sheets

0sccm CHLORINE

80sccm CHLORINE

160sccm CHLORINE

240sccm CHLORINE

SILICON NANO WIRES, SEMICONDUCTOR DEVICE INCLUDING THE SAME, AND METHOD OF MANUFACTURING THE SILICON NANO WIRES

This application claims priority to Korean Patent Application Nos. 10-2005-0016184 and 10-2006-0009821, filed on Feb. 25, 2005 and Feb. 1, 2006, respectively, and all the benefits accruing therefrom under 35 U.S.C. §119, the contents of which are incorporated herein in their entirety by reference.

BACKGROUND OF THE INVENTION

1. Field of the Invention

The present invention relates to silicon nano wires, a semiconductor device including the same, and a method of manufacturing the silicon nano wires.

More particularly, the present invention relates to nano wires having a p-n junction structure in which the size and distribution of nucleation regions for forming the nano wires are accurately controlled when forming silicon nano wires, and a method of manufacturing the same.

2. Description of the Related Art

Nano wires are currently being widely researched, and are a next-generation technology used in various devices such as optical devices, transistors, and memory devices. Materials used in conventional nano wires include silicon, zinc oxide, and gallium nitride, which is a light emitting semiconductor. The conventional nano wire manufacturing technique is sufficiently developed to be used for altering of the length and width of nano wires.

Quantum dots or nano light emitting devices using quantum dots are used in conventional nano light emitting devices. Organic electroluminescent (EL) devices using quantum dots have high radiative recombination efficiency but low carrier injection efficiency. Gallium nitride light-emitting diodes (GaN LEDs), which use quantum wells, have relatively high radiative recombination efficiency and carrier injection efficiency. However, it is very difficult to mass produce GaN LED due to a defect caused by the difference in the crystallization structures of the GaN LED and a commonly used sapphire substrate. Thus the manufacturing costs of GaN LEDs are relatively high. A nano light emitting device using nano wires has very high radiative recombination efficiency and relatively high carrier injection efficiency. In addition, the manufacturing process of a nano light emitting device is simpler and a nano light emitting device can be formed to have a crystallization structure that is practically similar to that of a substrate. Thus it is easier to mass produce the nano light emitting device.

FIGS. 1A through 1D are cross-sectional views illustrating a vapor-liquid-solid (VLS) method, which is a conventional method of manufacturing nano wires.

Referring to FIG. 1A, first, a substrate 11 is provided. The substrate 11 is a commonly used silicon substrate.

Thereafter, referring to FIG. 1B, a metal layer 12 is formed on top of the substrate 11 by spreading a metal such as Au.

Then, referring to FIG. 1C, the resultant structure is thermally processed at approximately 500° C. As a result, materials in the metal layer 12 are agglomerated, thereby forming catalysts 13. The sizes of the catalysts 13 may be irregular, that is, they have random sizes such as varying thickness and width.

After forming the catalysts 13 as described above, nano wires 14 are formed as the catalysts 13 as nucleation regions, as illustrated in FIG. 1D. The nano wires 14 are formed by supplying, for example, silane ($SiH_4$), which is a compound of silicon and hydrogen, to the catalysts 13 to induce nucleation of Si of silane at the locations where the catalysts 13 are formed. When silane is continually supplied, the nano wires 14 can continuously grow from the bottom of the catalysts 13, as illustrated in FIG. 1D.

As described above, nano wires with desired lengths can be easily formed by appropriately controlling the amount of supplied material gas such as silane. However, the growth of nano wires can be limited by the diameters and distribution, (such as the arrangement, location, formation regions, spacing or density) of the catalysts. Thus it is difficult to accurately control the thickness and distribution of nano wires. In addition, nano wire doping as described above may be performed by mixing a supply gas and a doping material, but nano wires cannot be formed to have a p-n junction structure.

SUMMARY OF THE INVENTION

The present invention provides silicon nano wires including a p-n junction structure and a method of manufacturing the nano wires in which the p-n junction structure have desired sizes and distribution by controlling the diameters and distribution of the silicon nano wires, a semiconductor device including the silicon nano wires, and a method of manufacturing the silicon nano wires.

In an exemplary embodiment, a method of manufacturing silicon nano wires includes forming microgrooves on a silicon substrate, forming a first doping layer doped with a first dopant on the silicon substrate, and forming a second doping layer doped with a second dopant between the first doping layer and a surface of the silicon substrate, forming a metal layer on the silicon substrate, forming catalysts by heating the metal layer within the microgrooves and growing the nano wires between the catalysts and the silicon substrate using a thermal process.

In another exemplary embodiment, a semiconductor device includes a semiconductor substrate including a plurality of microgrooves, nano wires formed in each of the microgrooves and extending in a direction substantially perpendicular to the semiconductor substrate, and having a p-n junction structure in which a first doping region and a second doping region are formed and a metal catalyst formed on one end of each of the nano wires.

In another exemplary embodiment, a silicon nano wire structure includes a p-n junction structure in which a first doping region and a second doping region are formed and a metal catalyst on one end of each of the nano wires.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
FIGS. 1A through 1D are cross-sectional views illustrating a conventional method of manufacturing nano wires.
Figure 1B:
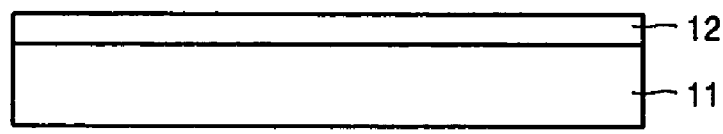
Figure 1C:
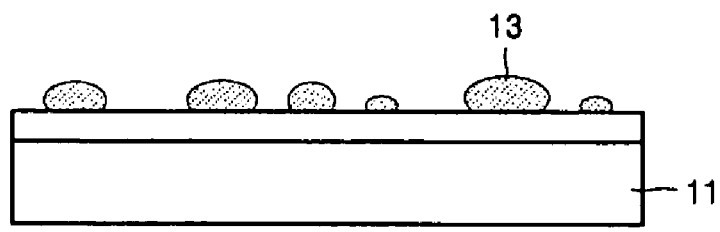
Figure 1D:
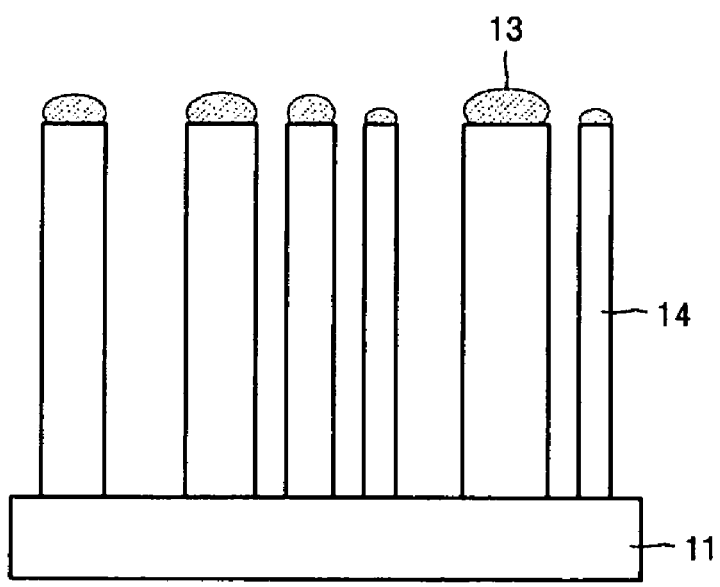

Silicon nano wires, a semiconductor device including the silicon nano wires, and a method of manufacturing the silicon nano wires according to the present invention will now be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
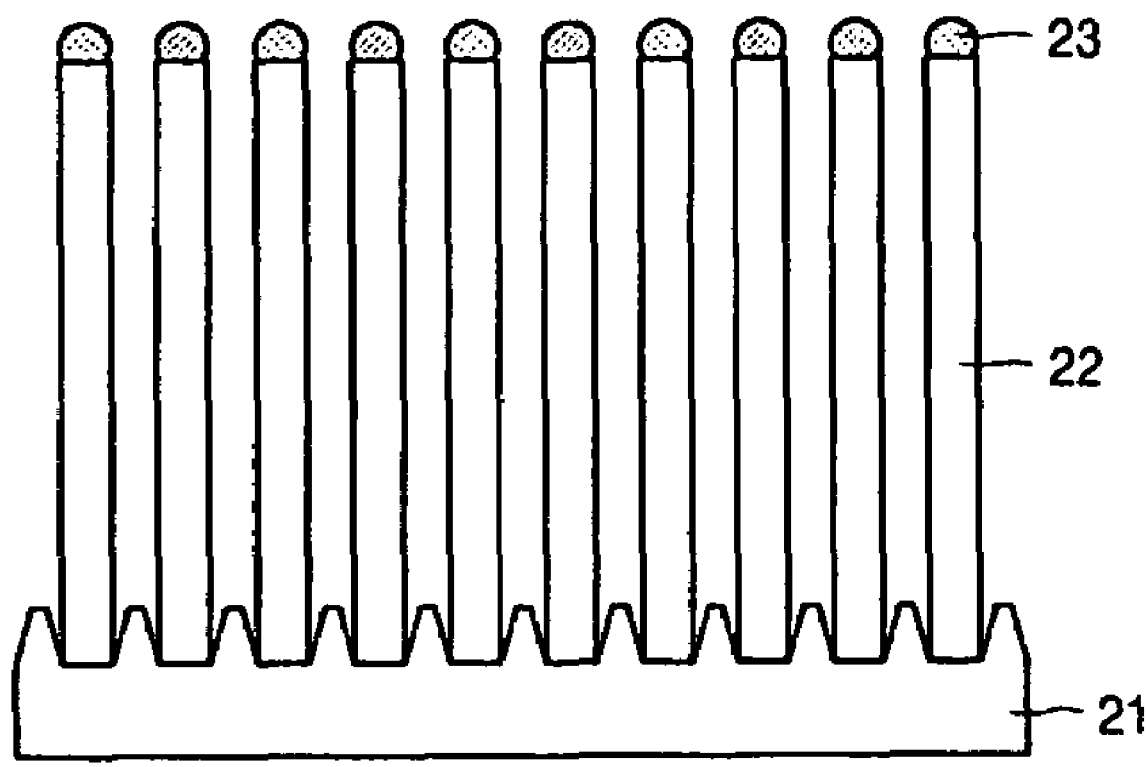
FIG. 2 is a cross-sectional view of an exemplary embodiment of silicon nano wires formed on a semiconductor substrate according to the present invention.

Before explaining for forming of silicon nano wires having a p-n junction structure, the structure of nano wires and a method of manufacturing the same will be described. FIG. 2 is a cross-sectional view of nano wires 22 formed on a semiconductor substrate according to an embodiment of the present invention. Referring to FIG. 2, microgrooves including a plurality of microcavities are formed in the surface of a substrate 21. The nano wires 22 grown in a vertical direction are formed in the microgrooves, and a catalyst 23 is formed on one end of each of the nano wires 22. The microgrooves formed in the surface of the substrate 21 are formed to a desired dimension, such as width and/or depth, and the sizes (such as width, diameter or thickness) and distribution of the nano wires 22 formed on the substrate 21 are substantially determined according to the dimensions and distribution of the microgrooves. The microgrooves may be formed in any of a number of shapes and profiles such as is suitable for the purpose described herein. Exemplary embodiment of the microgrooves include a substantially concave or rounded shape or generally a "V" shape.

An exemplary embodiment of a method of forming the microgrooves including the microcavities in the surface of the substrate 21 will be described below together with a method of manufacturing the nano wires 22.

FIGS. 3A through 3D are cross-sectional views illustrating an exemplary embodiment of a method of manufacturing nano wires according to the present invention.

Figure 3A:
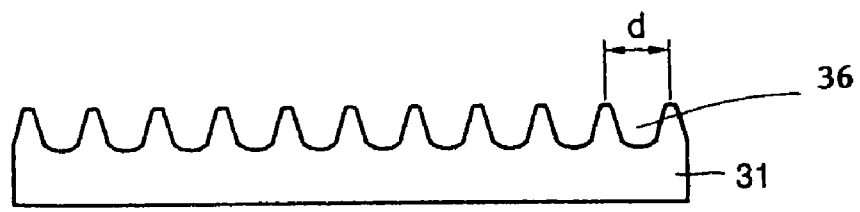
FIGS. 3A through 3D are cross-sectional views illustrating an exemplary embodiment of a method of manufacturing nano wires according to the present invention.
Figure 3B:
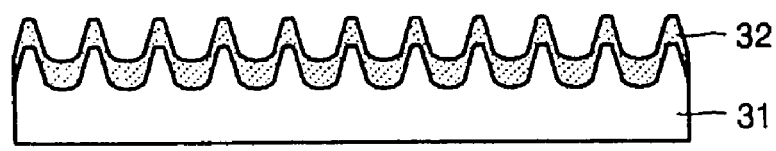

Referring to FIG. 3A, first, a substrate 31 having microgrooves 36 in its surface is provided. The microgrooves 36 having widths "d" are formed in the substrate 31. The microgrooves having the microcavities may be formed as follows.

First, a dry oxidation process is performed on a surface of the silicon substrate 31, in which microgrooves having microcavities are to be ultimately formed, to form a silicon oxide layer ($SiO_2$) (not shown) on the surface of the silicon substrate 31. The oxidation process may be performed by a dry oxidation process under an oxygen ($O_2$) and chlorine gas ($Cl_2$) atmosphere, and nitrogen gas ($N_2$) can be further added to control the pressure within a process chamber. The dry oxidation process is performed at a high temperature of about 1150° C. for a relatively long period of time (i.e., several hours to tens of hours). In alternative exemplary embodiments, the silicon oxide layer can be formed using a wet oxidation process. The pressure inside the process chamber is determined by oxygen and nitrogen gas, and chlorine gas may be added in a smaller ratio than oxygen.

Chlorine gas increases the oxidation rate during the dry oxidation process. That is, chlorine gas accelerates the reaction or diffusion of oxidants at an interface between the silicon oxide layer and the substrate 31 which is a silicon layer. In addition, chlorine gas traps and neutralizes sodium in the oxide layer, and getters may be added to absorb metallic impurities and prevent stacking faults from the silicon layer. Excess chlorine beyond the threshold concentration causes the formation of additional phases between the oxide layer and the silicon layer due to the accumulation of gaseous oxidation products, thereby making the interface ($SiO_2$/Si) between the oxide layer and the silicon layer rougher, or generally irregular.

Since, chlorine causes the interface between the silicon oxide layer and the silicon layer of the substrate 31 to be rougher, microgrooves are formed, thereby enabling formation of a superior quality silicon oxide layer. Thereafter, when the silicon oxide layer on the surface of the substrate 31 is removed through an etching process, a microgroove structure including microcavities as illustrated in FIG. 3A is formed.

Referring to FIGS. 6A through 6D, AFM images include exemplary embodiments of surfaces of substrates to which different amounts of chlorine gas is injected. FIGS. 6A through 6D respectively illustrate where 0, 80, 160, and 240 standard cubic centimeters per minute (sccm) of chlorine gas are injected into the process chamber. As the amount of injected chlorine gas increases, the surface gets rougher, thereby increasing the width "d" of the microgrooves.

Figure 6A:
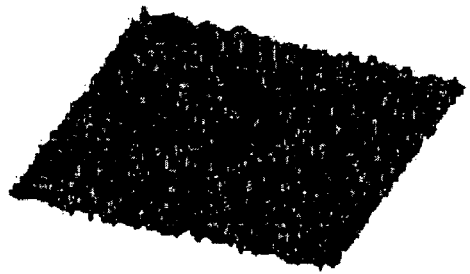
FIGS. 6A through 6D are atomic force microscopy (AFM) images of exemplary embodiments of surfaces of substrates manufactured with a microsurface structure illustrated in FIG. 3A.
Figure 6B:
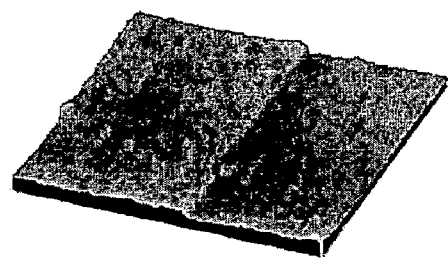
Figure 6C:
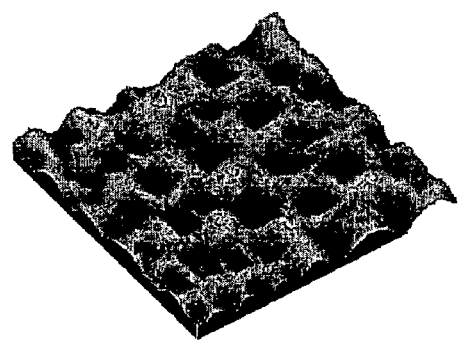
Figure 6D:
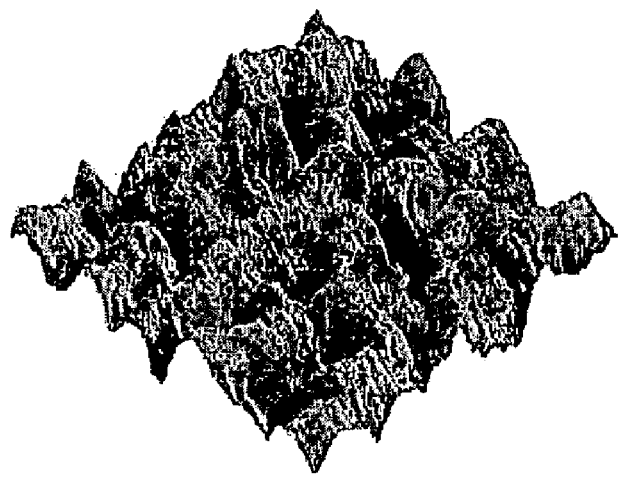
Figure 6E:
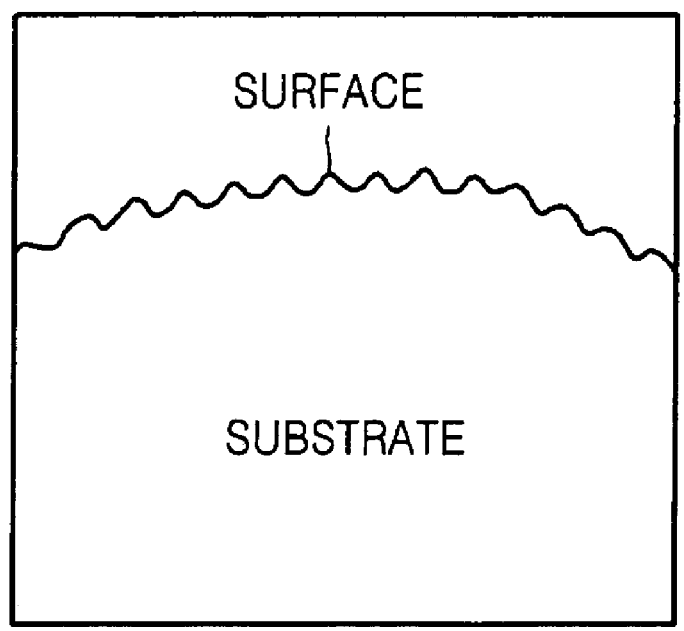
FIG. 6E is a graph illustrating surface roughness of a cross section of the substrate illustrated in FIG. 6D.

FIG. 6E is a graph illustrating an exemplary embodiment of surface roughness in nanometers (nm) of a cross section of the substrate after being injected with 240 sccm of chlorine gas. The left and right sections of the graph are shown distorted, but it can be seen that a microgroove surface with relatively regular grooves and having an illumination of several nm is obtained. That is, microgrooves formed at intervals of several nm can have a microcavity structure.

Referring again to FIGS. 3A-3E, after forming the microgrooves having microcavities with substantially uniform, or regular, arrangement in the substrate 31 as described above, a metal layer 32 is formed on top of the substrate 31, as illustrated in FIG. 3B. The metal layer 32 may be made of a material which can act as a catalyst to form nano wires that are to be grown. The material may include, but is not limited to a transition metal such as Au, Ni, Ti, or Fe. The metal layer 32 is formed relatively thinly to a thickness of several nm. The metal layer 32 includes microgrooves (having microcavities) with a relatively regular arrangement, generally corresponding to the shape or profile of the surface of the substrate 31 formed below the metal layer 32.

Figure 3C:
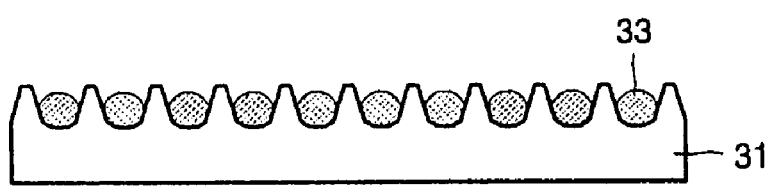

Next, referring to FIG. 3C, the metal layer 32 is heated to induce agglomeration of the metal layer 32. In exemplary embodiments, it may be sufficient if the metal layer 32 is heated to about 500° C. The material composing the metal layer 32 is agglomerated within the microgrooves on the surface of the substrate 31 due to the heat and forms catalysts 33 that are nano-sized. In other words, the microgrooves formed in the surface of the substrate 31 at the beginning are for controlling the locations at which the catalysts 33, which are formed by agglomerating the metal layer 32, are to be formed and the sizes such as width and thickness of the catalysts 33. As a result, regions in which the catalysts 33 are formed are limited by the microgrooves and the sizes such as the material quantity, thickness or width of the catalysts 33 can be substantially controlled by the dimensions of the microgrooves.

Figure 3D:
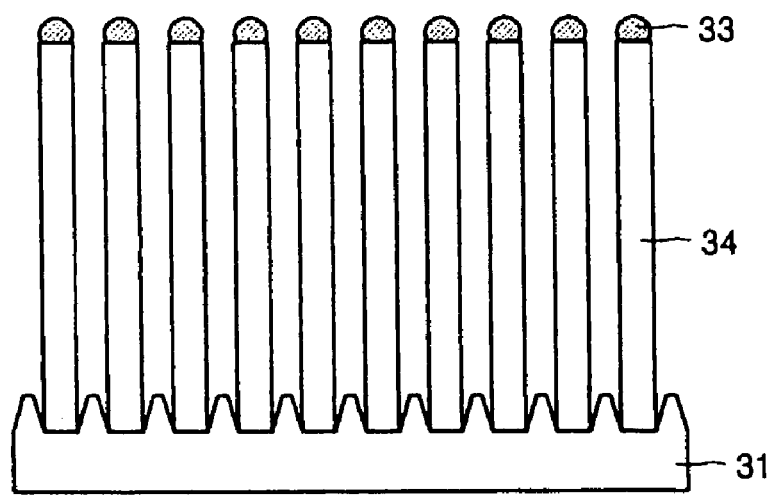

Thereafter, referring to FIG. 3D, nano wires 34 are formed where the catalysts 33, which act as nucleation regions, are formed. The nano wires 34 are formed by inducing nucleation of Si in the microgrooves of the substrate 31 where the catalysts 33 are formed at a temperature higher than the eutectic temperature (about 363° C. in the case of Au). The nano wires 34 can grow to a desired length as measured in a substantially vertical direction (or a direction perpendicular to a surface of the substrate 31 including the microgrooves) in FIG. 3D, by controlling the temperature, the atmospheric pressure, and time. In exemplary embodiments, the temperature can range from about 500° C. to about 1100° C., and the pressure can range from 100 Torr to normal atmospheric pressure.

Consequently, the thickness (or width) of the nano wires 34 as measured in a direction substantially perpendicular to the length can be controlled by forming microgrooves of a desired dimension or width with microcavities in the surface of the substrate 31, and the nano wires 34 can be grown with relatively uniform widths.

Figure 3E:
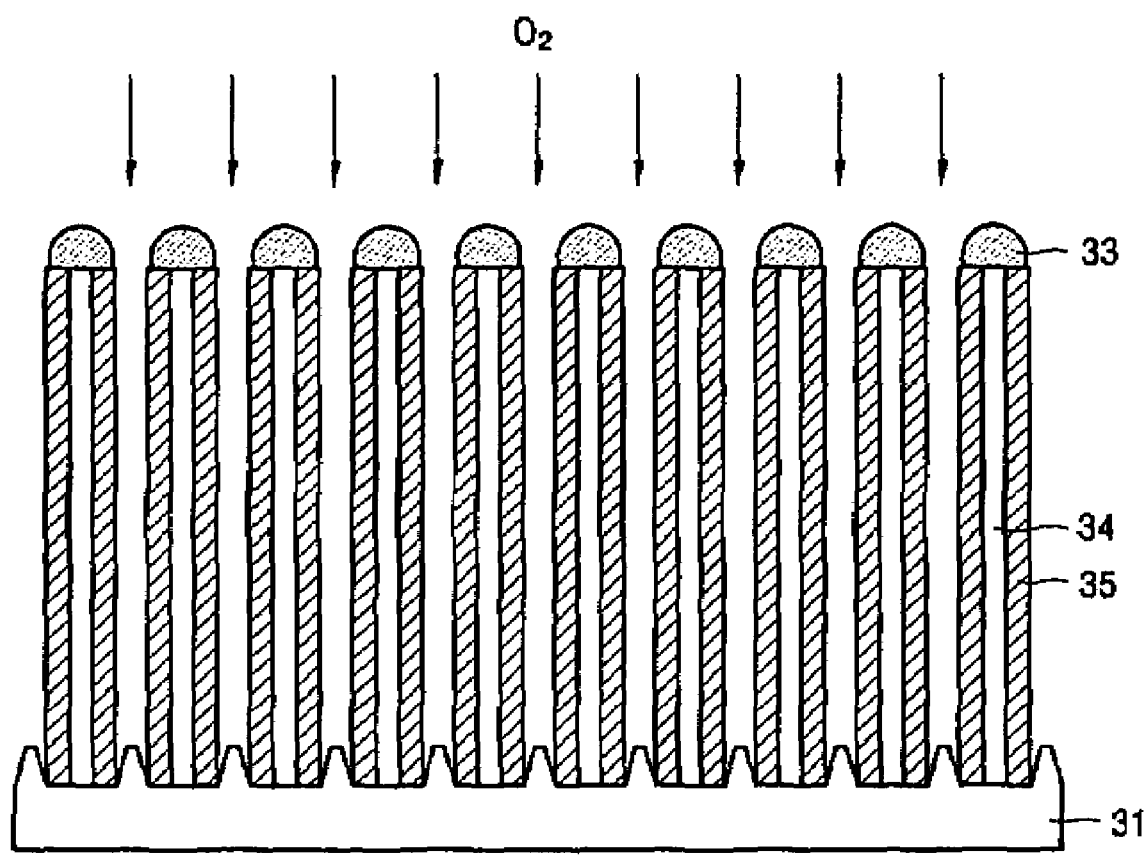
FIG. 3E is a cross-sectional view illustrating an exemplary embodiment of an oxidation process further performed to the nano wires manufactured through the method illustrated in FIGS. 3A through 3D to control diameters of the nano wires.

Referring to FIG. 3E, in another exemplary embodiment, an oxidation process can be additionally performed to control the widths of the nano wires 34. That is, when the oxidation process is performed after the nano wires 34 are formed, the formation of silicon oxide layers 35 is accelerated, especially on sides of the nano wires 34, thereby further enabling the controlling of the thickness of the nano wires 34.

An exemplary embodiment of a method of manufacturing a semiconductor device including the silicon nano wires according to the present invention, which uses the method of manufacturing the nano wires described with reference to FIGS. 3A through 3E, will now be described with reference to FIGS. 4A through 4D.

Figure 4A:
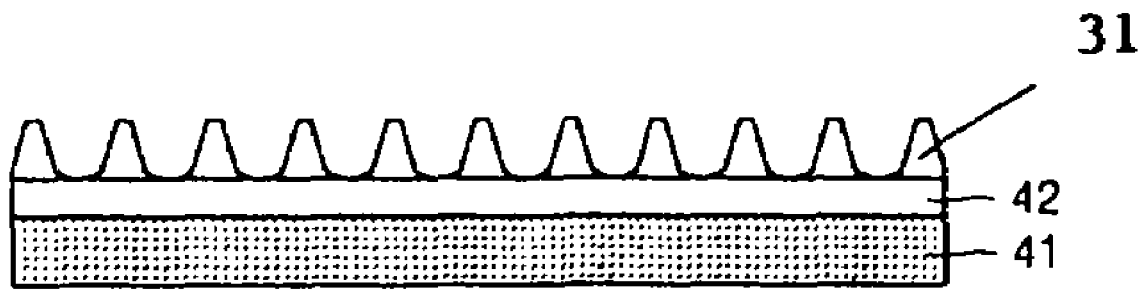
FIGS. 4A through 4D cross-sectional views illustrating an exemplary embodiment of a method of manufacturing nano wires having a p-n junction structure according to the present invention.

Referring to FIG. 4A, a first doping layer 41 is formed on a substrate 31 in which microgrooves with microcavities are formed. A second doping layer 42 is formed on top of the first doping layer 41 and between the first doping layer 41 and the substrate 31. In exemplary embodiments, if the first doping layer 41 is doped with a p-type dopant, the second doping layer 42 may be doped with an n-type dopant, and vice versa. The first and second doping layers 41 and 42 are formed by injecting p- and n-type dopants into different locations of the substrate in which microgrooves are formed.

Figure 4B:
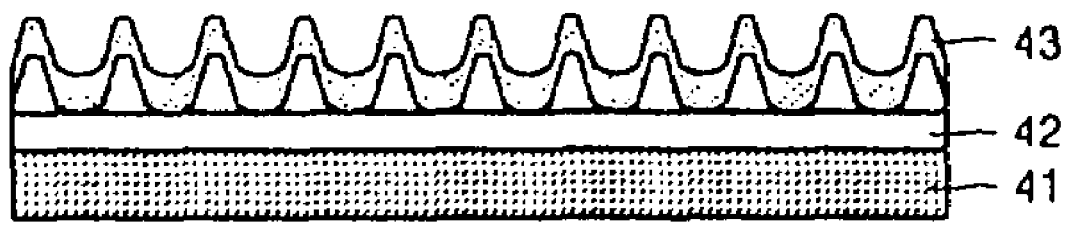

Thereafter, referring to FIG. 4B, a metal layer 43 is formed on the second doping layer 42. The metal layer 43 may be composed of a material which can act as a catalyst to form nano wires. In more detail, the material may include, but is not limited to, a transition metal such as Au, Ni, Ti, or Fe.

Figure 4C:
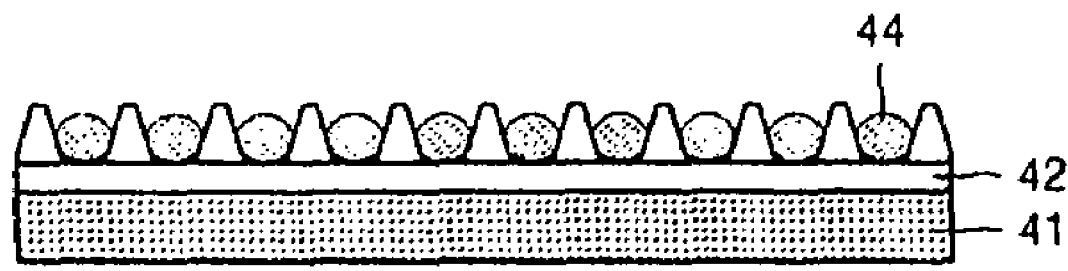

Next, referring to FIG. 4C, the metal layer 43 is heated to induce agglomeration and aggregation of the metal layer 43 so that catalysts 44 are formed in the microgrooves having microcavities. The catalysts 44 are formed in the microgrooves, and thus the sizes and distribution of the catalysts 44 are substantially defined by the widths and formation regions of the microgrooves.

Figure 4D:
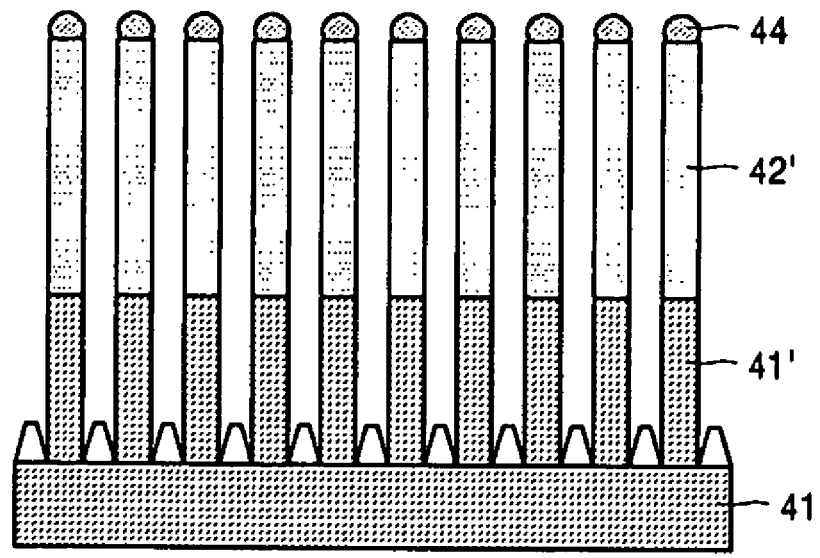

Thereafter, referring to FIG. 4D, nano wires are formed where the catalysts 44 are formed in the microgrooves by inducing nucleation with Si elements and heating the catalysts 44 to a temperature higher than the eutectic temperature. In exemplary embodiments, the process may be performed with a temperature ranging from about 500° C. to about 1,100° C. A dopant of the second doping layer 42 is distributed to nano wire regions below the catalysts 44 where the nano wires are to be formed to form second nano wires 42'. In exemplary embodiment, where the nano wires are continually grown, a dopant of the first doping layer 41 is injected into the lower portion of the second nano wires 42', thereby forming first nano wires 41'. As a result, a p-n junction structure is formed in the nano wires.

Figure 5:
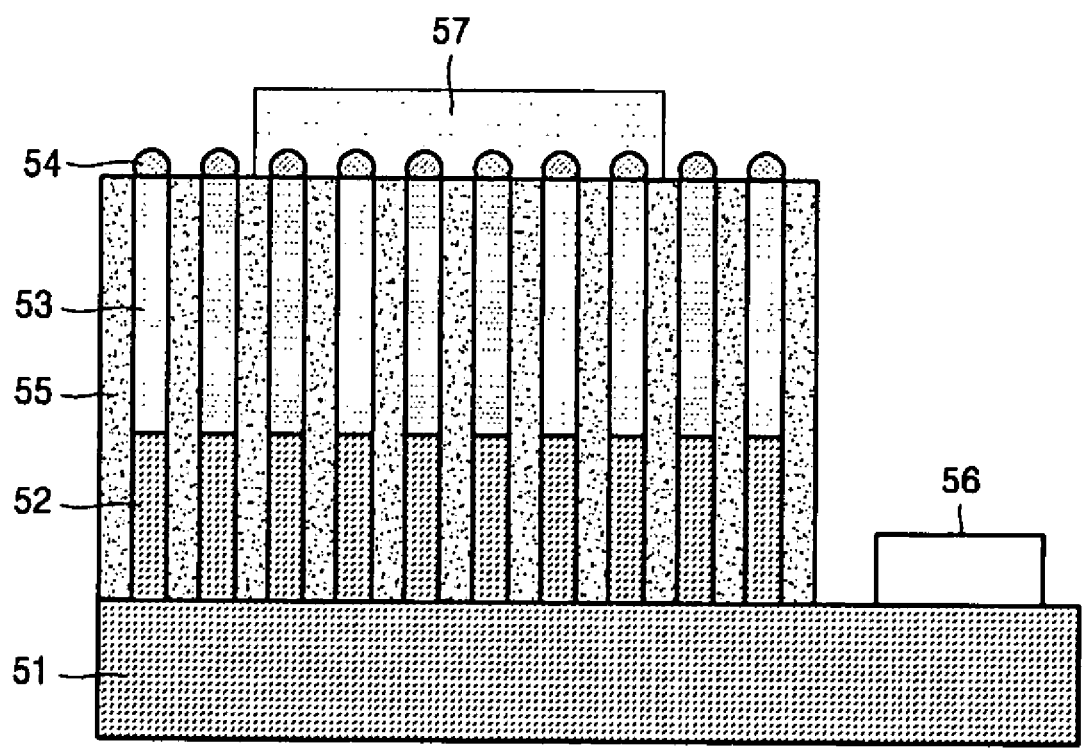
FIG. 5 is a cross-sectional view of an exemplary embodiment of a semiconductor device including the nano wire having the p-n junction structure manufactured through the method illustrated in FIGS. 4A through 4D.

FIG. 5 is a cross-sectional view of an exemplary embodiment of a semiconductor device including the nano wires having the p-n junction structure manufactured through the method illustrated in FIGS. 4A through 4D.

Referring to FIG. 5, photoresist layers 55 are formed between the nano wires having the p-n junction structure illustrated in FIG. 4D by depositing a photoresist. The p-n junction nano wires are formed on a portion of a substrate 51 using catalyst 54 and include a second nano wire 53 and a first nano wire 52. A first electrode 56 is formed on another portion of the substrate 51 located a distance away from the p-n junction nano wires. A second electrode 57 is formed on top of the nano wires. Such a structure can be used in nano light emitting devices using nano wires, and has an advantage of having a very high radiative recombination efficiency and a relatively high carrier injection efficiency, as mentioned above.

According to the present invention, the widths and distribution of nano wires to be formed may be substantially limited and controlled by the dimensions and distribution of microgrooves of a substrate, by manufacturing the nano wires on the substrate in which the microgrooves having microcavities are formed. The dimension and distribution of the microgrooves on the substrate may also be controlled. Nano-sized p-n junction diodes that include the pn-n junction nano wires can be used as nano light emitting devices or electronic devices which have very high radiative recombination efficiency and relatively high carrier injection efficiency. The p-n junction structure may be easily formed in the nano wires by applying the method of manufacturing the nano wires according to the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing silicon nano wires, the method comprising:
    forming microgrooves on a first side of a silicon substrate,
    forming a first doping layer doped with a first dopant on a second side of the silicon substrate, and forming a second doping layer doped with a second dopant between the first doping layer and the silicon substrate, the second side of the silicon substrate being opposite to the first side relative to the silicon substrate;
    forming a metal layer on the silicon substrate;
    forming catalysts by heating the metal layer within the microgrooves; and
    growing the nano wires between the catalysts and the silicon substrate using a thermal process.

2. The method of claim 1, wherein the forming of the microgrooves comprises:
    forming a microgroove structure by oxidizing a surface of the silicon substrate to form a silicon oxide layer; and
    exposing the microgroove structure by removing the silicon oxide layer.

3. The method of claim 1, wherein, the forming of the metal layer comprises depositing a catalyst material.

4. The method of claim 1, wherein, the forming of the metal layer comprises coating a transition metal.

5. The method of claim 1, wherein the metal layer comprises one of Au, Ni, Ti, Fe, and a combination including at least one of the foregoing.

6. The method of claim 1, wherein the growing the nano wires comprises controlling a temperature and atmospheric pressure of the thermal process.

7. The method of claim 1, wherein the thermal process is performed at a temperature higher than a eutectic temperature of the catalysts and the silicon substrate.

8. The method of claim 1, wherein the growing the nano wires comprises forming an oxide layer on sides of the nano wires after forming the nano wires.

9. The method of claim 1, wherein the first dopant is a p-type dopant, and the second dopant is an n-type dopant.

10. The method of claim 1, wherein the first dopant is an n-type dopant, and the second dopant is a p-type dopant.

11. The method of claim 1, wherein, growing of the nano wires comprises forming a p-n junction structure in the nano wires, the p-n structure comprising a first doping region and a second doping region in the nano wires.

12. The method of claim 8, wherein the final width of the nano wires includes the oxide layer.

* * * * *